United States Patent [19]

Mehrgardt

[11] Patent Number: 4,751,576
[45] Date of Patent: Jun. 14, 1988

[54] DIGITAL CIRCUIT FOR CLASSIFYING THE FREQUENCY OF A SIGNAL IN FREQUENCY RANGES

[75] Inventor: Soenke Mehrgardt, March, Fed. Rep. of Germany

[73] Assignee: Deutsch ITT Industries GmbH, Freiburg, Fed. Rep. of Germany

[21] Appl. No.: 903,558

[22] Filed: Sep. 4, 1986

[30] Foreign Application Priority Data

Sep. 6, 1985 [EP] European Pat. Off. ........ 85111258.1

[51] Int. Cl.$^4$ ............................................. H04N 5/04
[52] U.S. Cl. ................................... 358/148; 358/158; 324/78 D
[58] Field of Search ............... 358/148, 158, 153, 154; 324/79 D, 78 Q, 78 D; 379/386, 372; 328/138; 377/20; 340/825.64, 825.71; 364/484; 329/107; 307/524; 375/89

[56] References Cited

U.S. PATENT DOCUMENTS

| 3,537,001 | 12/1968 | Friend | 324/78 D |
| 3,990,007 | 11/1976 | Hohhof | 324/78 Q |
| 4,021,741 | 5/1977 | Collins et al. | 340/825.71 |
| 4,119,808 | 10/1978 | Atkin | 324/78 D |
| 4,326,256 | 4/1982 | Furumoto | 364/484 |

Primary Examiner—James J. Groody
Assistant Examiner—David E. Harvey
Attorney, Agent, or Firm—T. L. Peterson

[57] ABSTRACT

The frequency of a signal is classified in at least two nonoverlapping frequency ranges using the variable frequency of a clock signal as a reference. The clock signal is applied to the count input of a first up counter, and the signal to the reset input of this up counter and to the enable input of a first buffer. The parallel inputs of the first buffer are connected to the count outputs of the up counter, and the parallel outputs of this buffer are coupled to the parallel inputs of a multiple comparator in which each nonoverlapping frequency range is assigned a digital output. Each of these digital outputs is connected to the D input of a D flip-flop, which is clocked by the signal, and to one of the two inputs of an EXOR gate having its other input connected to the Q output of the associated flip-flop. The signal is also fed to the count input of a second up counter whose reset input is connected to the output of an OR gate having each of its inputs connected to the output of one of the EXOR gates, and the count outputs of the second up counter are each coupled to one of the inputs of an AND gate. The output of the latter is connected to the enable input of a second buffer whose inputs are each connected to the Q output of one of the D flip-flops and whose outputs are the frequency-range outputs.

6 Claims, 2 Drawing Sheets

DIGITAL CIRCUIT FOR CLASSIFYING THE FREQUENCY OF A SIGNAL IN FREQUENCY RANGES

BACKGROUND OF THE INVENTION

The invention pertains to a digital circuit for classifying the frequency of a signal in at least two non-overlapping frequency ranges using the variable frequency of a clock signal as a reference.

In electronics, there is the need for a circuit which instead of measuring the variable frequency of a signal and, thus, determining the exact numerical frequency value, classifies the frequency of the signal in frequency ranges and produces a digital signal one level of which is assigned the information that the frequency lies in the associated frequency range.

SUMMARY OF THE INVENTION

One object of the invention is to provide such a digital circuit using the variable frequency of a clock signal as a reference.

A special application of the invention is in a television receiver with digital signal-processing circuitry, where the horizontal frequency not only equals that of a conventional television standard but also may assume 1.5 times or twice the value of that frequency. These three values for the horizontal frequency may be delivered to the television receiver by, e.g., a video recorder in which picture signals assigned to such different horizontal frequencies are stored. In the television receiver, the digital circuit according to the invention must then discriminate the different horizontal frequencies error-free. This must be ensured even if the clock frequency, used as a reference, is not constant but varies between, e.g., 12 and 15 MHz, as in the illustrative embodiment described below.

In accordance with the invention, the frequency of a signal is classified in at least two nonoverlapping frequency ranges using the variable frequency of a clock signal as a reference. The clock signal is applied to the count input of a first up counter, and the signal to the reset input of this up counter and to the enable input of a first buffer. The parallel inputs of the first buffer are connected to the count outputs of the up counter, and the parallel outputs of this buffer are coupled to the parallel inputs on a multiple comparator in which each nonoverlapping frequency range is assigned a digital output. Each of these digital outputs is connected to the D input of a D flip-flop, which is clocked by the signal, and to one of the two inputs of an EXOR gate having its other input connected to the Q output of the associated D flip-flop. The signal is also fed to the count input of a second up counter whose reset input is connected to the output of an OR gate having each of its inputs connected to the output of one of the EXOR gates, and the count outputs of the second up counter are each coupled to one of the inputs of an AND gate. The output of the latter is connected to the enable input of a second buffer whose inputs are each connected to the Q output of one of the D flip-flops and whose outputs are the frequency-range outputs.

BRIEF DESCRIPTION OF THE DRAWING

The invention will be better understood from a reading of the following detailed description in conjunction with the drawing in which.

DETAILED DESCRIPTION

Figure 1:
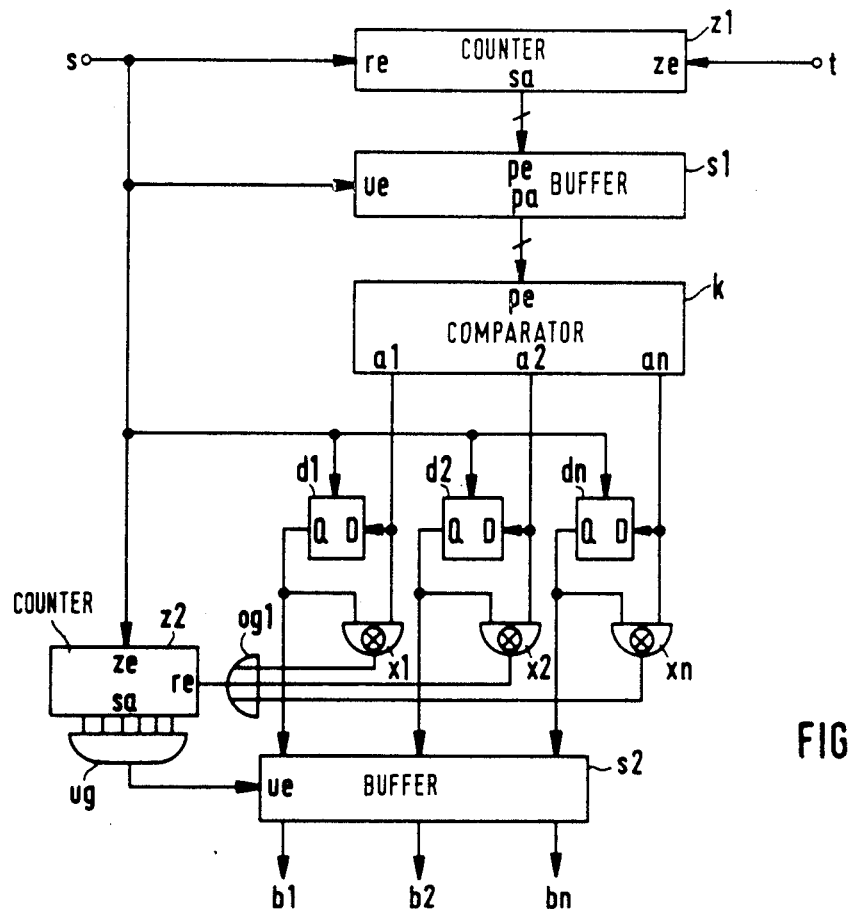
FIG. 1 is a block diagram of an embodiment of the invention.

In the block diagram of FIG. 1, which shows a general embodiment of the invention, the count input ze of the up counter z1 is presented with the clock signal t, and the reset input re with the signal s. The latter is also applied to the enable input ue of the first buffer s1, i.e., to the input which, when activated, permits the signal at the parallel buffer inputs pe to be transferred into the cells of the buffer. These inputs are connected to the count outputs sa of the first up counter z1, while the parallel outputs pa of the first buffer s1 are connected to the parallel inputs pe of the multiple comparator k. In the latter, each nonoverlapping frequency range is assigned a digital output a1, a2, an. The multiple comparator k can also be regarded as a window comparator which provides at each of its outputs a1, a2, an a digital signal one level of which indicates that the count of the up counter z1 lies within the range of numbers assigned to the output (cf. FIG. 3, where the range of 480 to 699 is assigned to the output a2, for example).

The outputs a1, a2, an are connected, respectively, to the D inputs D of the D flip-flops d1, d2, and dn, which are clocked by the signal s, and to the first inputs of the EXOR gates x1, x2, and xn. Coupled to the second input of each of the EXOR gates x1, x2, xn is the Q output of the associated D flip flop d1, d2, dn.

The outputs of these EXOR gates are each connected to one of the inputs of the first OR gate og1, whose output is coupled to the reset input re of the second up counter z2, whose count input ze is presented with the signal s. Each of the count outputs sa of the second up counter z2 is connected to an input of the AND gate ug, whose output is connected to the enable input ue of the second buffer s2. Each of the inputs of the buffer s2 is connected to the Q output of one of the D flip-flops d1, d2, dn, and the outputs b1, b2, bn of the buffer s2 are the respective frequency-range outputs of the digital circuit.

The positive-going edge of a pulse of the signal s resets the first up counter z1; at the same time, the instantaneous count of the latter is transferred into the first buffer s1, so that the above-mentioned classification in numerical-value ranges can be performed with the multiple comparator k. The second up counter z2 is reset whenever the output state of the multiple comparator k changes between two successive pulses of the signal s, i.e., on a transition from HLL to LHL, for example. When the second up counter z2 is "full", i.e., when, in positive logic, all count outputs sa are at the H level, activation of the enable input of the second buffer s2 via the AND gate ug permits the instantaneous state in the multiple comparator k to be transferred into the buffer s2. This state is not changed until the output state of the multiple comparator k has remained unchanged as many times as corresponds to the capacity of the second counter z2. If the up counter z2 is a six-stage binary counter, for example, the output state of the multiple comparator k must remain unchanged during $2^6 = 64$ pulses of the signal s.

Figure 2:
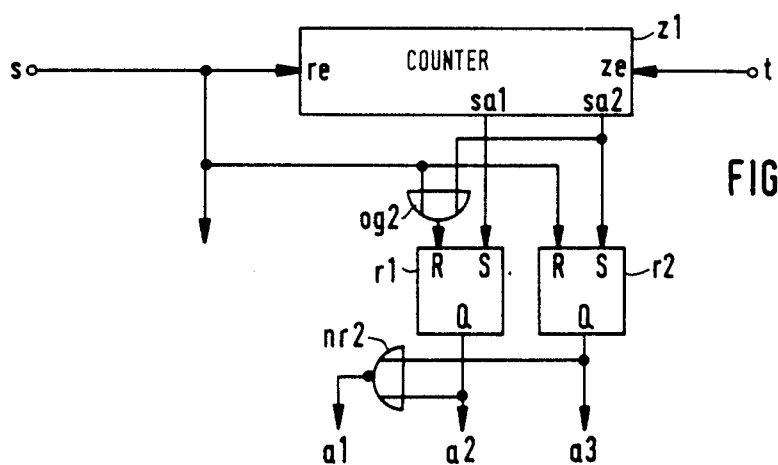
FIG. 2 shows a simplification of part of the arrangement of FIG. 1 for three nonoverlapping frequency ranges.

FIG. 2 shows a simplified arrangement for the first buffer s1 and the multiple comparator k if three nonoverlapping frequency ranges are preset. The subcircuits s1, k are implemented with the second OR gate og2, the first and second RS flip-flops r1, r2, and the second NOR gate nr2. The count output sa1 for the upper limit of the first frequency range is coupled to the S input of the RS flip-flop r1, and the count output sa2 for the upper limit of the second frequency range to the S input of the RS flip-flop r2. One of the two inputs of the second OR gate og2 and the R input of the second RS flip-flop r2 are presented with the signal s, and the other input of the second OR gate og2 is connected to the count output sa2 for the upper limit of the second frequency range. The R input of the first RS flip-flop r1 is connected to the output of the second OR gate og2. The Q output of each of the RS flip-flops r1, r2 is fed to one of the two inputs of the second NOR gate nr2, whose output corresponds to the first output a1 of the multiple comparator k, while the second and third outputs a2, a3 of the latter are formed by the Q outputs of the first RS flip-flop r1 and the second RS flip-flop r2, respectively.

Figure 3:
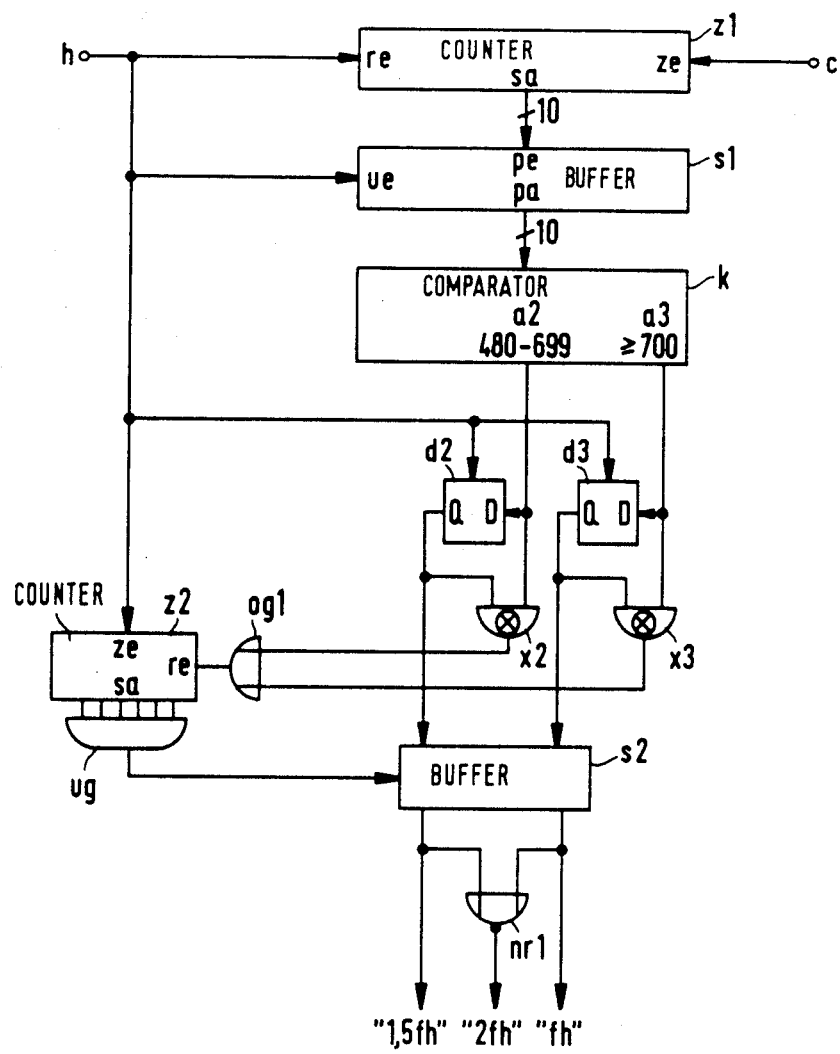
FIG. 3 is a block diagram of an embodiment for use in television receivers.

FIG. 3 shows the block diagram for the preferred use mentioned at the beginning. Here, the signal s and the clock signal t of FIGS. 1 and 2 are, respectively, the horizontal synchronizing pulses h and the system clock c of a television receiver with digital signal-processing circuitry. The up counters z1 and z2 have a capacity of $2^{10}$ and $2^6$, respectively, which is indicated in the former case by the numbers 10 at the oblique strokes in the interconnecting leads between the first up counter z1 and the first buffer s1 and between the latter and the multiple comparator k. There are provided three frequency ranges, namely zero to fh, fh to 1.5 fh, and 1.5 fh to 2 fh, where fh is the horizontal frequency.

The first digital output a1 of the multiple comparator k of FIGS. 1 and 2 is not used, and the first D flip-flop d1 and the first EXOR gate x1 of FIG. 1 have been replaced by the first NOR gate nr1. The two inputs of the latter are connected to the two outputs of the second buffer s2, from which the signals "fh" and "1.5 fh" are obtainable, whereas the signal "2 fh" appears at the output of the first NOR gate nr1.

If the arrangement of FIG. 3 is designed for an NTSC television receiver, the second output a2 of the multiple comparator k will be assigned to the numerical values 480 to 699, and the third output a3 to the numerical values equal to or greater than 700.

The digital circuit of the invention permits error-free classification of the frequency of the signal s, particularly of the horizontal synchronizing pulses h. It is well suited for integration and can be incorporated, for example, into an existing or yet-to-be designed large-scale integrated circuit. Insulated-gate field-effect transistor circuits, i.e., MOS technology, are especially suitable for implementing the circuit.

What is claimed is:

1. A digital circuit for classifying the frequency of a signal in at least two nonoverlapping frequency ranges using the variable frequency of a clock signal as a reference, said circuit comprising:

first and second counters each having a reset input, count input and count outputs;

first and second buffers each having an enable input, parallel inputs and outputs;

said signal being coupled to said first counter reset input, said second counter count input and to said first buffer enable input;

said clock signal being coupled to said first counter count input;

said first counter count outputs coupled to said first buffer parallel inputs;

a comparator having inputs coupled to said first buffer parallel outputs and having a plurality of digital outputs, each digital output being assigned to one of said nonoverlapping frequency ranges;

a plurality of flip flops each having a data input connected to one of said comparator digital outputs, each of said flip flips being clocked by said signal and having an output;

logic circuit means for providing at an output the logical function of the "OR" of the exclusive "OR" of said flip flop output and said flip flop data input for each of said plurality of flip flops;

said second counter reset input coupled to the output of said logic circuit means and having count outputs;

said second buffer inputs each coupled to one of said flip-flop outputs, said second buffer enable input receiving a signal when said second counter count outputs reach a predetermined state, and wherein said second buffer outputs indicate the frequency range in which the frequency of said signal is classified.

2. A digital circuit for classifying the frequency of an input signal in three nonoverlapping frequency ranges using the frequency of a clock signal as a reference, said circuit comprising:

a first counter having a reset input, a count input and a count output, said clock signal coupled to said count input of said first counter, said input signal coupled to said reset input of said first counter, said first counter having a first count output for the upper limit of a first frequency range of said input signal, and having a second count output for the upper limit of a second frequency range of said input signal;

first and second RS flip flops, each of said first and second RS flip-flops having an R input, an S input and a Q output, said first and second count outputs of said first counter being coupled to the S inputs of said first and second RS flip-flops, respectively;

a first OR gate having a first input, a second input and an output, said first input of said first OR gate coupled to said second count output of said first counter, and said second input of said first OR gate coupled to said signal, said output of said first OR gate coupled to the R input of said first RS flip-flop, said signal being coupled to the R input of said second RS flip-flop;

a first NOR gate having a first input, a second input and an output, said first and second inputs coupled to the outputs of said first and second RS flip flops, respectively, the output of said first NOR gate and the outputs of said first and second RS flip-flops providing first, second and third digital outputs, each digital output being assigned to one of said three nonoverlapping frequency ranges;

first, second and third D flip-flops, each having a D flip-flop data input, a clock input and a D flip-flop data output, each D flip-flop data input connected to a respective one of said digital outputs, each of said clock inputs of said first, second and third D flip flops being clocked by said input signal;

logic circuit means for providing at an output the logical function of the "OR" of the exclusive "OR"

of said D flip-flop data output and said D flip-flop data input for each of said first, second and third D flip-flops;

a second counter, having a reset input, a count input and a plurality of count outputs, said reset input of said second counter coupled to said output of said logic circuit means, said count input coupled to said input signal; and a buffer having an enable input, first, second and third parallel inputs, and first, second and third parallel outputs, said first, second and third parallel inputs of said buffer coupled to said D flip-flop data outputs of said first, second and third D flip-flops, respectively, said enable input receiving a signal when said outputs of said second counter reach a predetermined state, said parallel outputs of said buffer indicating the frequency range in which the frequency of said input signal is classified.

3. A digital circuit for classifying the frequency of a horizontal synchronizing signal in a plurality of frequency ranges using the system clock of a television receiver as a reference, said circuit comprising:

first and second counters each having a reset input, a count input and a count output;

first and second buffers each having an enable input, parallel inputs and outputs;

said horizontal synchronizing signal being coupled to said first counter reset input, said second counter count input and to said first buffer enable input;

said system clock being coupled to said first counter count input;

said first counter count outputs coupled to said first buffer parallel inputs;

a comparator having inputs coupled to said first buffer parallel outputs, said comparator having first and second outputs assigned respectively to first and second ones of said plurality of frequency ranges;

first and second flip flops each being clocked by said horizontal synchronizing signal, each having a data input coupled respectively to said comparator first and second outputs, and each having an output;

logic circuit means for providing at a logic output the logical function of the "OR" of the exclusive "OR" of said first flip flop data input with said first flip flop output and said second flip flop data input with said second flip flop output;

said second counter reset input coupled to said logic circuit means logic output;

said second buffer having a first input coupled to said first flip flop output, a second input coupled to said second flip flop output, said second buffer enable input receiving a signal when said second counter reaches a predetermined count, said second buffer having a first output signal for indicating a first frequency range and a second output signal for indicating a second frequency range.

4. A digital circuit in accordance with claim 3, comprising:

a second logic circuit means for deriving the "NOR" function of said second buffer first and second output signals to provide a signal output indicating a third frequency range.

5. A digital circuit in accordance with claim 4, wherein:

said first, second and third frequency ranges are 0 to fh, fh to 1.5 fh, and 1.5 fh to 2.0 fh, respectively where fh is a predetermined horizontal frequency.

6. A digital circuit in accordance with claim 5, wherein:

said first counter is an up counter having a count capacity of $2^{10}$;

said second counter is an up counter having a count capacity of $2^6$;

said comparator first output represents numerical values of 480 to 699;

said comparator second output represents numerical values equal to or greater than 700; and said digital circuit is used in a television receiver utilizing the NTSC standard.

* * * * *